(12) United States Patent
Gleissner et al.

(10) Patent No.: US 11,942,356 B2
(45) Date of Patent: Mar. 26, 2024

(54) CLIPPING MECHANISM FOR FASTENING A SUBSTRATE FOR A SURFACE TREATMENT OF THE SUBSTRATE

(71) Applicant: SEMSYSCO GMBH, Salzburg (AT)

(72) Inventors: Andreas Gleissner, Dobriach (AT); Ulrich Tschinderle, Villach (AT)

(73) Assignee: SEMSYSCO GMBH, Salzburg (AT)

( * ) Notice: Subject to any disclaimer, the term of this patent is extended or adjusted under 35 U.S.C. 154(b) by 0 days.

(21) Appl. No.: 18/025,577

(22) PCT Filed: Oct. 12, 2021

(86) PCT No.: PCT/EP2021/078208
§ 371 (c)(1),
(2) Date: Mar. 9, 2023

(87) PCT Pub. No.: WO2022/084109
PCT Pub. Date: Apr. 28, 2022

(65) Prior Publication Data
US 2023/0260823 A1    Aug. 17, 2023

(30) Foreign Application Priority Data
Oct. 20, 2020 (EP) .................................... 20202781

(51) Int. Cl.
*H01L 21/687* (2006.01)

(52) U.S. Cl.
CPC .. *H01L 21/68721* (2013.01); *H01L 21/68707* (2013.01); *H01L 21/68728* (2013.01); *H01L 21/68742* (2013.01)

(58) Field of Classification Search
CPC ......... H01L 21/68728; H01L 21/68707; H01L 21/68721; H01L 21/67712; B25B 5/06; Y10T 24/307; Y10T 24/314; Y10T 24/303

(Continued)

(56) References Cited

U.S. PATENT DOCUMENTS 9,341,204 B2 *   5/2016   Fischer ................. F16B 5/0642
10,283,396 B2 *   5/2019   Keigler ............. H01L 21/68707
(Continued)

FOREIGN PATENT DOCUMENTS

CN    109661721 A     4/2019
CN    115036235 A  *  2/2022
(Continued)

OTHER PUBLICATIONS

International Search Report and Written Opinion of the International Searching Authority for Application No. PCT/EP2021/078208, dated Jan. 21, 2022.
(Continued)

*Primary Examiner* — Mahdi H Nejad
(74) *Attorney, Agent, or Firm* — MARSHALL, GERSTEIN & BORUN LLP

(57) ABSTRACT

The disclosure relates to a clipping mechanism for fastening a substrate for a surface treatment of the substrate, a clipping module for holding a substrate for a surface treatment of the substrate and a method for assembling a clipping mechanism for fastening a substrate for a surface treatment of the substrate. The clipping mechanism for fastening a substrate for a surface treatment of the substrate comprises a clipping bracket and an actuation unit. The clipping bracket comprises in a cross-section a first arm and a second arm. The first arm is moveable relative to the second arm to a receiving position for the substrate with a receiving distance between the first arm and the second arm. The first arm is moveable relative to the second arm to a fastening position for the substrate with a fastening distance between the first arm and the second arm. The fastening distance is smaller than the receiving distance. The actuation unit is at least partially surrounded by the clipping bracket. At least a portion of the actuation unit is moveable relative to the (Continued)

clipping bracket to move the first arm in the receiving position or the fastening position.

6 Claims, 3 Drawing Sheets

(58) Field of Classification Search
USPC .................................. 269/152; 24/131 R
See application file for complete search history.

(56) References Cited

U.S. PATENT DOCUMENTS

| | | | |
|---|---|---|---|
| 10,483,138 B2* | 11/2019 | Lu ..................... | H01L 21/68707 |
| 2006/0192400 A1* | 8/2006 | Kim ................... | H01L 21/68707 |
| | | | 294/103.1 |
| 2009/0293435 A1* | 12/2009 | Johnson .................. | B65B 45/00 |
| | | | 53/461 |
| 2010/0117280 A1* | 5/2010 | Ishino .................. | B65G 49/063 |
| | | | 29/559 |
| 2011/0276082 A1* | 11/2011 | Fehring ................ | A61H 1/0285 |
| | | | 606/204 |
| 2015/0038954 A1* | 2/2015 | Nau, Jr. ................. | A61B 18/22 |
| | | | 606/10 |
| 2015/0042026 A1* | 2/2015 | Uemura ................ | H05K 3/241 |
| | | | 269/254 R |
| 2017/0372937 A1* | 12/2017 | Keigler ............. | H01L 21/68707 |
| 2018/0261491 A1 | 9/2018 | Lu et al. | |
| 2019/0151908 A1* | 5/2019 | Sauvinet .............. | B65G 49/064 |
| 2020/0013655 A1 | 1/2020 | Schober et al. | |
| 2022/0181191 A1* | 6/2022 | Segal ................ | H01L 21/68728 |
| 2023/0130419 A1* | 4/2023 | Solari ................ | H01L 21/02074 |
| | | | 134/1.3 |

FOREIGN PATENT DOCUMENTS

| | | |
|---|---|---|
| EP | 2392528 A1 | 12/2011 |
| JP | H11111659 A | 4/1999 |
| KR | 2008/0114155 A | 12/2008 |
| WO | WO-2008/148580 A2 | 12/2008 |
| WO | WO-2011/066701 A1 | 6/2011 |
| WO | WO-2014/168149 A1 | 10/2014 |
| WO | WO-2017/193001 A1 | 11/2017 |

OTHER PUBLICATIONS

European Search Report for Application No. 20202781.9, dated Mar. 11, 2021.
European Communication Under Rule 71(3) EPC for Application No. 20202781.9, dated May 23, 2022.
European Communication pursuant to Article 94(3) EPC for Application No. 20202781.9, dated Sep. 6, 2021.
Decision to grant a European Patent Pursuant to Article 97(1) EPC for Application No. 20202781.9, dated Sep. 8, 2022.
Extended European Search Report for Application No. 21177304.9, dated Sep. 7, 2021.
Taiwan Office Action for Application No. 110138556 with Translation, dated Dec. 27, 2022.
First Chinese Office Action for Application No. 202180070405.0, dated Nov. 22, 2023.

* cited by examiner

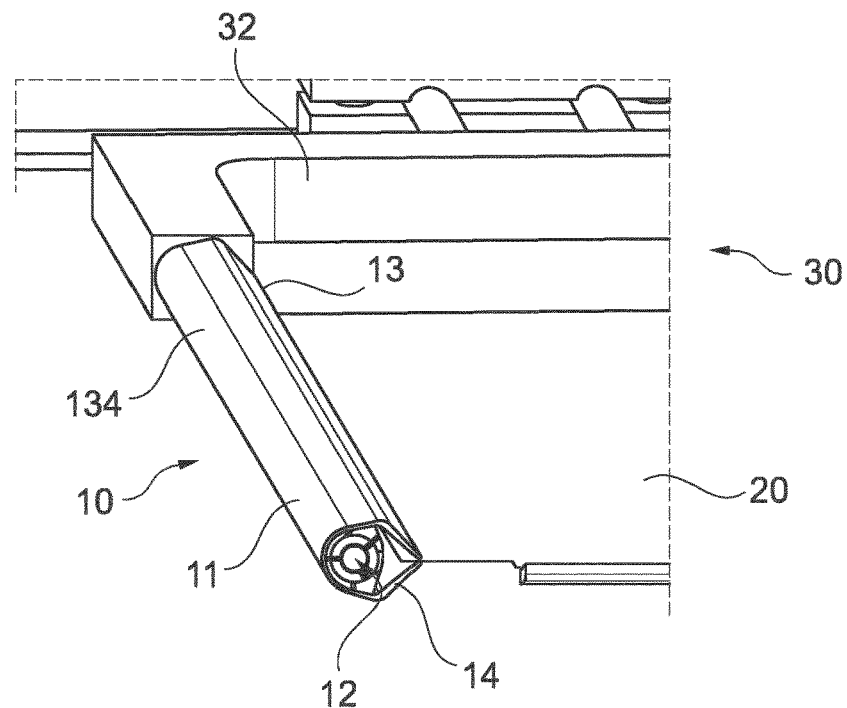
Fig. 5
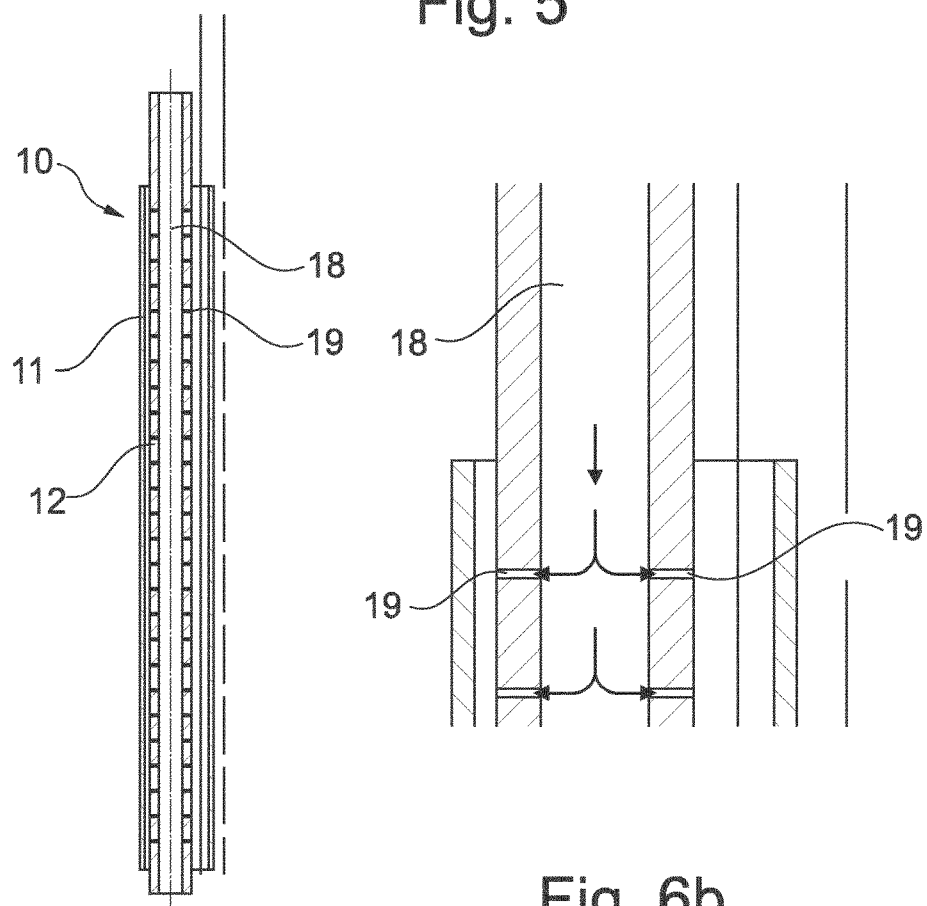
Fig. 6a
Fig. 6b

CLIPPING MECHANISM FOR FASTENING A SUBSTRATE FOR A SURFACE TREATMENT OF THE SUBSTRATE

CROSS-REFERENCE TO RELATED APPLICATION

This present application is the US national phase of International Patent Application No. PCT/EP2021/078208, filed Oct. 12, 2021, which claims priority to European Application No. 20202781.9, filed Oct. 20, 2020. These applications are hereby incorporated by reference in their entireties.

TECHNICAL FIELD

The present disclosure relates to a clipping mechanism for fastening a substrate for a surface treatment of the substrate, a clipping module for holding a substrate for a surface treatment of the substrate and a method for assembling a clipping mechanism for fastening a substrate for a surface treatment of the substrate.

BACKGROUND

In many industries, it is a basic requirement to be able to fixate and handle fragile substrates in so called handling, holding or processing frames in a simple and secure way to enable automatic loading and unloading of the substrate for productivity and other reasons. This is especially of importance for industries where large size substrates, i.e. substrates with large outer dimensions, diameters or circumferences must be handled. In addition, such substrates are very often very thin and can be made of a semiconductor, an insulator (e.g. glass or quartz), a polymer/plastic and the like.

Additional requirements, which must be considered, when designing such large substrate holding frames are based on the individual use of such holding frames for securing the substrate during a specific process carried out on the substrate surface or multiple surfaces of the substrate.

Very critical examples, where such frames play a very important role in the outcome of the process are to be found e.g. in the semiconductor industry, including solar cell and printed circuit board production processes, as well as the manufacturing of flat panel displays and the like.

Processes in these and similar industries, which depend on an optimized functioning of such substrate holding frames are numerous: material deposition, lithography, wet- and dry-etching, substrate cleaning and the like.

As a specific example, there exists a very specific challenge in the substrate wet-cleaning area. Chemical rinsing processes, which are carried out in-between various chemical processing steps, as well as a final substrate rinsing and drying process has to be not only supported but also enabled by such a substrate holding frame in order to avoid any chemical residues or drying residues (also called drying stains). Wet-cleaning processes are carried out in many different ways e.g. through chemical spray or immersion tape processing.

In another specific example, such a holding frame is applied to hold a substrate for introducing the substrate to an electroplating process. Then, as an additional requirement, the holding frame has to provide for extremely well controlled electrical contacts to the substrate surface or to multiple surfaces of the substrate.

The prior art describes various ways of fixing and holding substrates. The limitations of the prior art systems are mainly to be found in a complexity of the mechanism to fixate and hold the substrate in place. Most systems use a complex and bulky mechanical clamping mechanism like a hinged frame, which encloses the substrate on multiple sites and shields large parts of the substrate corners from the process. In case chemistry penetrates in-between the frame parts and the substrate, the chemistry is exceedingly difficult if not impossible to rinse out again and leads to chemical drag over to other parts of the equipment or even the whole fab. This leads certainly to manufacturing and yield issues, but can also cause danger to persons and damage to equipment. Other frame designs use individual clips to hold the frame in place, which usually also do not permit a thorough rinse and definitely not a good drying process, as corners and edges of the clip design may allow droplets of water to remain behind and evaporate. Any evaporation of a liquid will result in residues of non-volatile dissolved residues with the liquid.

SUMMARY

Hence, there may be a need to provide an improved clipping mechanism for fastening a substrate for a surface treatment of the substrate, which is in particular easy to handle.

The problem solved by the present disclosure is solved by the subject-matters of the independent claims, wherein further embodiments are incorporated in the dependent claims. It should be noted that the aspects of the disclosure described in the following apply also to the clipping mechanism for fastening a substrate for a surface treatment of the substrate, the clipping module for holding a substrate for a surface treatment of the substrate and the method for assembling a clipping mechanism for fastening a substrate for a surface treatment of the substrate.

According to the present disclosure, a clipping mechanism for fastening a substrate for a surface treatment of the substrate is presented. The clipping mechanism comprises a clipping bracket and an actuation unit. The clipping bracket comprises in a cross-section a first arm and a second arm. The first arm is moveable relative to the second arm. The first arm is moveable to a receiving position for the substrate with a receiving distance between the first arm and the second arm. The first arm is moveable to a fastening position for the substrate with a fastening distance between the first arm and the second arm. The fastening distance is smaller than the receiving distance. The actuation unit is at least partially surrounded by the clipping bracket. At least a portion of the actuation unit is moveable relative to the clipping bracket to move the first arm in the receiving position or the fastening position.

The present clipping mechanism may provide an elegant mechanical clamping mechanism with only a small number of components. The present clipping mechanism may therefore be easy to manufacture as well as easy to handle and to use. The present clipping mechanism may enable a fixation and securing of the substrate (especially for very thin and/or very large substrates) with ultimate reliability and avoidance of scratches. The present clipping mechanism may also provide very well controlled electrical contacts to the substrate surface or to multiple surfaces of the substrate for e.g. an electroplating process. The reason for both is that a holding force is equally distributed at least over one full length, preferably two (opposite to each other) or three or all four lengths of a rectangular or square substrate. For the same reason, the present clipping mechanism may enable an improved automatic loading and unloading of the substrate.

The present clipping mechanism does not shield large parts of the substrate from a process liquid (e.g. electrolyte, rinsing fluid etc.) and may therefore allow a more uniform surface treatment of the substrate. In this embodiment, the clipping mechanism may contact the substrate from a tip of the first arm and/or the second arm. By reducing the contact area between the clipping mechanism (in other words, the first and the second arm) and the substrate, a hindrance of the substrate surface from surface treatment is minimized. Further, by holding the substrate via the tips of the first and the second arms, the necessity of having a clipping mechanism, which is matching the geometry of the substrate, is avoided.

The present clipping mechanism may achieve an improved rinsing and drying result of the whole substrate without leaving unwanted residues. The reason is that the present clipping mechanism may enable a simple and open flow design without corners and edges, which could avoid droplets of liquids not being removed. The present clipping mechanism may be safer to use.

The substrate may be any plate shaped material with or without structures and/or layers on at least one of its surfaces. It may be a semiconductor, an insulator (e.g. glass, quartz, plastic, polymer etc.), a solar cell, a printed circuit board production, a (flat) panel display and/or the like.

The surface treatment of the substrate may be a chemical and/or electrolytic surface treatment of the substrate. It may be a material deposition, electroplating, lithography, a wet- or dry-etching, a wet- or dry-cleaning, a water or chemical rinsing and/or the like.

The clipping mechanism may be a mechanical clamping mechanism. It comprises a clipping bracket or clipping bar. The clipping bracket can be understood as a flexible, in particular elastic, openable bracket. It may comprise a body, which has (when seen in a top view or a cross-section) a housing part with a first arm and a second arm. The first arm and the second arm may extend from the housing part. The housing part may form a preferably round (but possibly also angular) back or spine. At least one of the first arm, the second arm or the housing part may be flexible and in particular elastic. The bracket and in particular the first arm, the second arm and the housing part may be made from one or more parts. This means the first arm, the second arm and the housing part may be all together only one single piece or they may be two or more components.

The first arm or rod is moveable relative to the second arm and in particular also relative to the housing part. The movability may be achieved by a means of at least a flexible and in particular elastic material and/or by a means of a mechanical component as e.g. a hinge, a film, a joint or the like. The first arm may be in an open position (receiving position) to receive the substrate. It then has a distance (receiving distance) relative to the second arm, which is larger than a thickness of the substrate. The first arm may be in a closed position (fastening position) to hold the substrate firmly. It may then have a distance (fastening distance) relative to the second arm, which is equal or smaller than a thickness of the substrate. The second arm may as well be in an open position (receiving position) to receive the substrate. It then has a distance (receiving distance) relative to the first arm, which is larger than a thickness of the substrate. The second arm may be in a closed position (fastening position) to hold the substrate firmly. It may then have a distance (fastening distance) relative to the first arm, which is equal or smaller than a thickness of the substrate. The fastening distance is consequently smaller than the receiving distance (in both cases). By having the flexibility of moving the first and the second arms independent from each other, the opening side of the clipping mechanism may be decided freely.

The second arm or rod may have the same shape and/or material and may be in particular symmetrical to the first arm. The first arm and the second arm can be both moveable relative to each other. They may both contribute to the change between the receiving distance and the fastening distance. The second arm may also be different to the first arm. It may be a fixed component or at least a less flexible component than the first arm or a rotational angle of the second arm (or the first arm) may be limited by a user.

The clipping mechanism further comprises an actuation unit. The actuation unit may be configured to move at least the first arm relative to the second arm. It may also be configured to move the second arm relative to the first arm. The actuation unit may therefore be in contact with the first arm and optionally also with the second arm. The actuation unit may be at least partially housed in the clipping bracket. This means it can be at least partially arranged within the clipping bracket and in particular surrounded by at least the housing part and optionally one or both arms of the clipping bracket. By placing the actuation unit inside the clipping bracket (more specifically, between the first and the second arms), a compact clipping mechanism is achieved. As the distance between the actuation unit and the clipping bracket is short, a wider angle may be obtained between the arms at the receiving position. The actuation unit may be part of the clipping bracket or only connected to the clipping bracket.

The clipping mechanism and in particular the clipping bracket and/or the actuation unit may form a rod shaped element configured to extend at least partially along the substrate to be fastened. In other words, the first arm and the second arm may be rod shaped and have an angular form comprising a first and a second part. At the first part, the first and the second arms may extend away from each other (for example, to receive the actuation spindle in between). At the second part, the first and the second arms may extend towards each other to meet in the middle (at the fastening position). The first and the second parts may have different thicknesses. Alternatively, the cross sections of the first and the second parts may gradually increase towards a connection between the first and the second parts.

In an embodiment, the actuation unit is or comprises an actuation spindle. The actuation spindle is rotatable relative to the clipping bracket. At least a portion of the actuation spindle comprises a cam, when seen in a cross-section. The cam may be arranged in contact and in cooperation with the clipping bracket to move the first arm in the receiving position or the fastening position when the actuation spindle is rotated. Accordingly, a movement of the cam may be directly translated to the first arm and a higher sensitivity in the actuation of the first arm may be achieved. The first arm may comprise a step or a bearing for the cooperation with the cam or the cam can simply contact any portion of the arm or as explained above, the cam may contact the first part of the first arm. The cam can be understood as a first cam.

In an embodiment, the actuation spindle comprises a second portion, which comprises a second cam, when seen in a cross-section. The second cam may be arranged in contact and in cooperation with the clipping bracket to move the second arm in the receiving position or the fastening position when the actuation spindle is rotated. The second cam and therefore the second arm may be moveable independently of the first cam and the first arm, respectively. This provides a higher degree of freedom in the movement of the arms. The second arm may comprise a step or a bearing for a cooperation with the second cam or the second cam can simply contact any portion of the second arm or the first part of the second arm.

The first cam may be a mirror symmetry of the second cam relative to a plane passing through the center of the actuation spindle and a meeting point of the arms at the fastening position.

In an embodiment, the clipping mechanism further comprises a drive unit configured to rotate the actuation spindle relative to the clipping bracket. The drive unit may be an electric, servo, pneumatic or hydraulic engine or the like. The drive unit may be supplied with energy by means of an energy supply, as for example a battery. The drive unit may be controlled by means of a control unit, as for example a processor. The drive unit may be built in the clipping mechanism (for instance in the actuation spindle) or placed outside and connect the clipping mechanism via a connection means.

In another embodiment, the actuation unit comprises an inflatable body, which is inflatable relative to the clipping bracket to move the first arm in the receiving position. The inflatable body may be made from an elastic material hull, as for example plastic and in particular a polymer. The inflatable body may have a cylindrical or round shape or the like. It may be arranged next or adjacent to the first arm. In an inflated condition, the inflatable body may connect or touch the first arm to cooperate with the first arm to push or move the first arm from the fastening position (more closed) to the receiving position (more open). In a deflated condition, the inflatable body may not touch the first arm or only slightly touch the first arm without transmitting a considerable force to the first arm. The first arm is not pushed or moved and stays or remains in the fastening position (more closed) or returns from the receiving position (more open) to the fastening position (more closed).

Additionally or alternatively, the inflatable body may be arranged next or adjacent to the second arm. In an inflated condition, the inflatable body may connect or touch the second arm to cooperate with the second arm to push or move the second arm from the fastening position (more closed) to the receiving position (more open). In a deflated condition, the inflatable body may not touch the second arm or only slightly touch the second arm without transmitting a considerable force to the second arm. The second arm is not pushed or moved and stays or remains in the fastening position (more closed) or returns from the receiving position (more open) to the fastening position (more closed).

In an embodiment, the clipping mechanism further comprises a pump unit configured to inflate and/or deflate the inflatable body relative to the clipping bracket. The pump unit may be configured to inflate and/or deflate the inflatable body with air, another gas or a liquid. The pump unit may be supplied with energy by means of an energy supply, as for example a battery. The pump unit may be controlled by means of a control unit, as for example a processor.

Besides to the drive unit or the pump unit, also other actuation units are possible to rotate, open and close the arm(s). For example, a spring unit, a magnetic unit, an electromagnetic unit and/or the like can be used.

In an embodiment, the clipping mechanism and in particular the clipping bracket and/or the actuation unit comprises a channel extending at least partially along a longitudinal axis of the clipping mechanism and in particular along the clipping bracket and/or the actuation unit. The channel may be arranged in the clipping bracket or it may be arranged on an outer circumference or surface of the clipping bracket. At least an opening may be connected to the channel and may be directed to the substrate, the actuation unit and/or to the clipping bracket to apply a fluid or a gas to the substrate and/or the clipping bracket. The opening may extend perpendicular to the longitudinal axis of the clipping mechanism. Preferably, the opening may have an angle of 5° to 90° to the longitudinal axis of the clipping mechanism, more preferably an angle of 30° to 75°. The opening may be at least a rinse and/or drying jet or nozzle.

The channel may be connected to a reservoir holding the fluid and/or gas. The channel may allow an efficient and effective rinsing and/or drying of the substrate, the actuation unit, the clipping bracket and/or the opening(s) of the channel to avoid a formation of stains (drying residues) and to enable a very fast rinsing and drying for higher throughput. The at least one opening can be a combined rinse and dry opening or there can be separate openings for rinsing and drying.

Alternatively or additionally, there can be rinsing and/or drying channel(s) and opening(s) located on a holding frame of the substrate and/or on a processing chamber.

Above described clipping mechanism can be understood as a first clipping mechanism. According to the present disclosure, also a clipping module for holding a substrate for a surface treatment of the substrate is presented. The clipping module comprises a first clipping mechanism as described above, a second clipping mechanism and a connecting unit. The connecting unit or connecting bar is arranged between the first clipping mechanism and the second clipping mechanism to connect the first clipping mechanism and the second clipping mechanism so that the first clipping mechanism, the connecting unit and the second clipping mechanism together at least partially surround three lateral sides of the substrate. In other words, the first clipping mechanism, the connecting unit and the second clipping mechanism may together form a frame at least partially surrounding and holding the substrate, for example at an upper and two lateral sides of the substrate or at an upper, a lateral and a lower side of the substrate.

In an embodiment, the clipping module further comprises a positioning unit configured to rotate at least the first clipping mechanism relative to the connecting unit into a loading position for the substrate. This can be understood in that the first clipping mechanism and in particular a clipping bracket of the first clipping mechanism may be rotated into an open or receiving position to allow an easy loading and unloading of the substrate into the clipping module. The positioning unit may be an electric, servo, pneumatic or hydraulic engine or the like. The positioning unit may be supplied with energy by means of an energy supply, as for example a battery. The positioning unit may be controlled by means of a control unit, as for example a processor. The positioning unit may prevent or reduce a damaging or scratching of the substrate surface during the loading and unloading.

A material for manufacturing the clipping mechanism(s) and/or the clipping module can be any material compatible with the process to be carried out, e.g. chemical compatible materials, polymers, metals, ceramics or also coated materials. To avoid scratching of a substrate during processing, a contact area of the clipping bracket with the substrate can be made of a material that is chosen specifically for each individual substrate material, e.g. according to Mohs scale of mineral hardness or any other relevant material hardness scale. This allows selecting a material that is slightly softer than the substrate material and enables to exercise a required retention force onto the substrate without creating particles or any other residues.

According to the present disclosure, also a use of the clipping mechanism(s) and/or the clipping module for fastening a substrate for a surface treatment of the substrate is presented. The clipping mechanism(s) and/or the clipping module can be in particular be used for large substrates, i.e. substrates with large outer dimensions, diameters or circumferences. The outer dimension or diameter can be 300 mm and more. The circumference can be 1200 mm and more. The clipping mechanism(s) and/or the clipping module can be in particular used for thin substrates. The thickness of the substrate may be 1 mm and less.

According to the present disclosure, also a method for assembling a clipping mechanism for fastening a substrate for a surface treatment of the substrate is presented. The method comprises the following steps, not necessarily in this order:

Providing a clipping bracket comprising in a cross-section a first arm and a second arm. At least the first arm is moveable relative to the second arm to a receiving position for the substrate with a receiving distance between the first arm and the second arm and to a fastening position for the substrate with a fastening distance between the first arm and the second arm. The fastening distance is smaller than the receiving distance.

Providing an actuation unit to be at least partially surrounded by the clipping bracket. At least a portion of the actuation unit is moveable relative to the clipping bracket to move the first arm in the receiving position or the fastening position.

The present method for assembling a clipping mechanism may provide an elegant assembling method with only a small number of assembling steps. The present assembling method may therefore be easy to implement as well as easy to use. The present assembling method may enable a fixation and securing of the substrate (especially for very thin and/or very large substrates) with ultimate reliability and avoidance of scratches. The assembling method may also provide very well controlled electrical contacts to the substrate surface or to multiple surfaces of the substrate for e.g. an electroplating process. The present assembling method may enable an improved automatic loading and unloading of the substrate and/or a more uniform surface treatment of the substrate and/or an improved rinsing and drying of the whole substrate.

In an embodiment, the method for assembling a clipping mechanism further comprises a step of providing a substrate in an opening provided by the first arm, when the first arm is in the receiving position. The opening may also be provided or enlarged by the second arm, when the second arm is alternatively or additionally in the receiving position. The provision of the opening can be followed by a step of moving the first and/or second arm from the receiving position into the fastening position to close the clipping bracket by means of the actuation unit.

It shall be understood that the device, the module and the method according to the independent claims have similar and/or identical preferred embodiments, in particular, as defined in the dependent claims. It shall be understood further that a preferred embodiment of the disclosure can also be any combination of the dependent claims with the respective independent claim.

These and other aspects of the present disclosure will become apparent from and be elucidated with reference to the embodiments described hereinafter.

BRIEF DESCRIPTION OF THE DRAWINGS

Exemplary embodiments of the disclosure will be described in the following with reference to the accompanying drawing:

FIG. 5 shows schematically and exemplarily an embodiment of a clipping module for fastening a substrate for a surface treatment of the substrate according to the disclosure.

FIGS. 6a-b show schematically and exemplarily an embodiment of a clipping mechanism for fastening a substrate for a surface treatment of the substrate according to the disclosure.

DETAILED DESCRIPTION OF EMBODIMENTS

Figure 1:
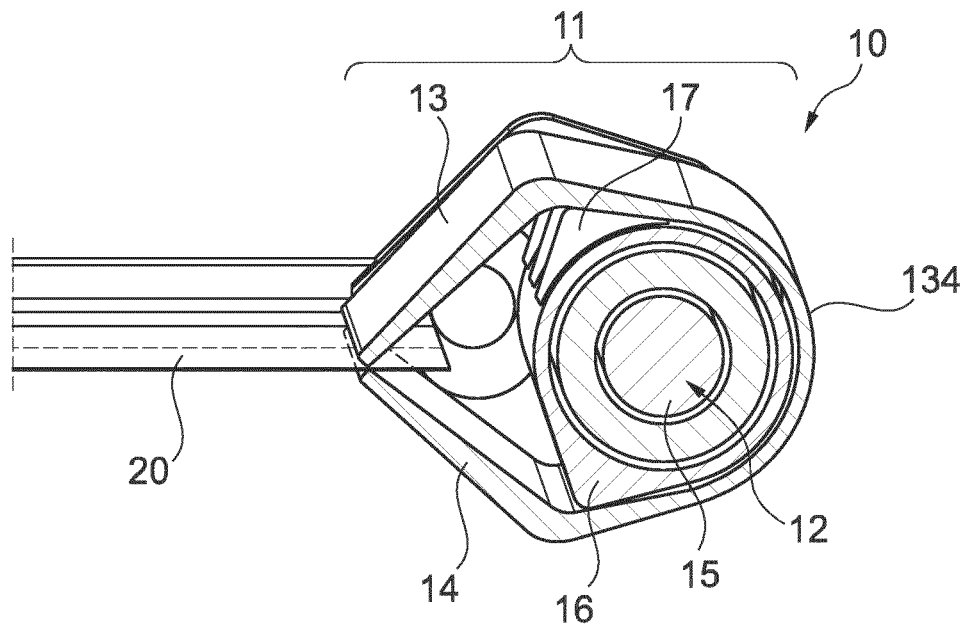
FIG. 1 shows schematically and exemplarily an embodiment of a clipping mechanism for fastening a substrate for a surface treatment of the substrate according to the disclosure.
Figure 2:
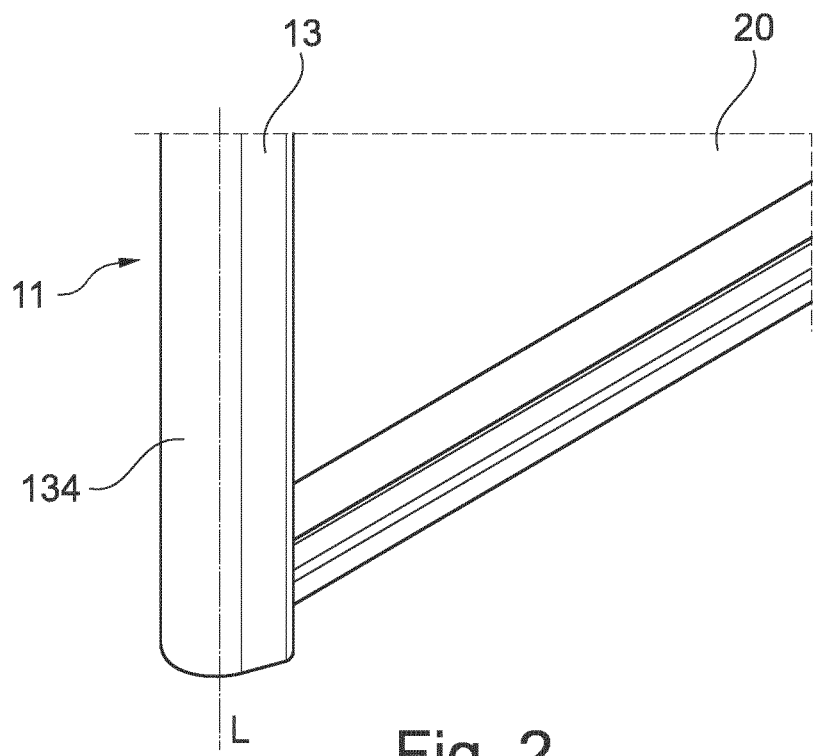
FIG. 2 shows schematically and exemplarily an embodiment of a clipping mechanism for fastening a substrate for a surface treatment of the substrate according to the disclosure in another perspective.
Figures 3A, 3B, 3C:
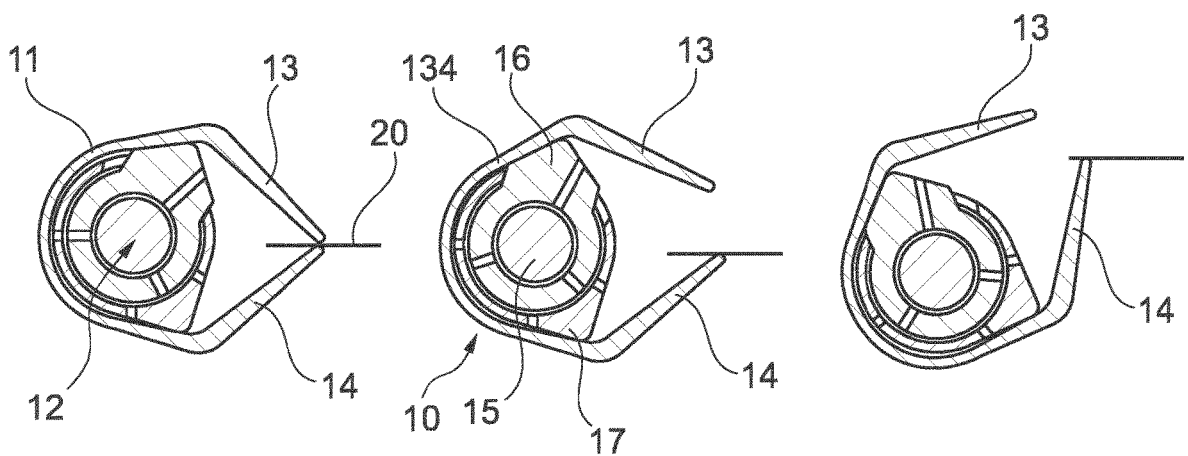
FIGS. 3a-c show schematically and exemplarily an embodiment of a clipping mechanism for fastening a substrate for a surface treatment of the substrate according to the disclosure.

FIGS. 1 to 3a-c show schematically and exemplarily an embodiment of a clipping mechanism 10 for fastening a substrate 20 for a surface treatment of the substrate 20 according to the disclosure. FIG. 1 shows the clipping mechanism 10 with the substrate 20 from below. FIG. 2 shows a lateral view of the clipping mechanism 10 with the substrate 20. The clipping mechanism 10 comprises a clipping bracket 11 and an actuation unit 12. The clipping mechanism 10 and in particular the clipping bracket 11 form a rod shaped element extending at least partially along the substrate 20. FIGS. 3a-c show the clipping mechanism 10 with the substrate 20 from below, FIG. 3a in a closed or fastening position, FIG. 3b in an opened or receiving position and FIG. 3c in a loading or unloading position.

The clipping bracket 11 comprises a round housing part 134, a first arm 13 and a second arm 14. The first arm 13 and the second arm 14 extend from the housing part 134. The first arm 13 and the second arm 14 are rod shaped and have an angular form consisting of a first and a second part. At the first part, the first and the second arms 13, 14 extend away from each other and receive the actuation spindle 15 in between. At the second part, the first and the second arms 13, 14 extend towards each other to meet in the middle when they are at the fastening position (as shown in FIG. 3a).

The first arm 13 is flexible and therefore moveable relative to the housing part 134 and the second arm 14. The first arm 13 is shown in FIGS. 1, 2 and 3a in a closed or fastening position for the substrate 20 with a fastening distance between the first arm 13 and the second arm 14. The first arm 13 is moveable to a more open receiving position for the substrate 20 with a receiving distance between the first arm 13 and the second arm 14, which is shown in FIG. 3b. The receiving distance is larger than the fastening distance. In the receiving position, the substrate 20 can be loaded or unloaded from the clipping bracket 11.

The second arm 14 has here the same shape and is in particular symmetrical to the first arm 13. The second arm 14 is also flexible and therefore moveable relative to the housing part 134 and the first arm 13. The second arm 14 is in FIGS. 1, 2 and 3a in a closed or fastening position for the substrate 20 with the fastening distance between the first arm 13 and the second arm 14. The second arm 14 is also moveable to a more open receiving position for the substrate 20 with the receiving distance between the first arm 13 and the second arm 14, which is shown in FIG. 3b. The first arm 13 and the second arm 14 both contribute to the change between the receiving distance and the fastening distance.

The actuation unit 12 is arranged within and surrounded by the clipping bracket 11 and in particular by the housing part 134 of the clipping bracket 11. The actuation unit 12 is in contact with and cooperates with the first arm 13 and the second arm 14. A first portion or first cam 16 of the actuation unit 12 is moveable in contact with the first arm 13 to move the first arm 13 between the receiving position and the fastening position. A second portion or second cam 17 of the actuation unit 12 is moveable in contact with the second arm 14 to move the second arm 14 between the receiving position and the fastening position.

The actuation unit 12 comprises an actuation spindle 15, which is rotatable relative to the clipping bracket 11. A portion of the actuation spindle 15 comprises a first cam 16. The cam 16 is in cooperation with the clipping bracket 11 (especially the first part of the first arm 13) to move the first arm 13 in the receiving position or the fastening position when the actuation spindle 15 is rotated. Another portion of the actuation spindle 15 comprises a second cam 17, which is in cooperation with the clipping bracket 11 (especially the first part of the second arm 14) to move the second arm 14 in the receiving position or the fastening position when the actuation spindle 15 is rotated. Both cams 16, 17 can be rotated independently from each other by means of the actuation spindle 15. The clipping mechanism 10 further comprises a drive unit (not shown) configured to rotate the actuation spindle 15 relative to the clipping bracket 11.

There is also a positioning unit (not shown), which is able to rotate the entire clipping bracket 11 with the housing part 134 and the first arm 13 (and not only the first arm 13) around a longitudinal extension L of the clipping mechanism 10. The rotation of the clipping mechanism 10 is shown in FIG. 3c and can be understood in that the entire clipping mechanism 10 is rotated into an open or loading position to allow an easier loading and unloading of the substrate 20 relative to the clipping bracket 11. The positioning unit may be an electric, servo, pneumatic or hydraulic engine or the like.

Figure 4:
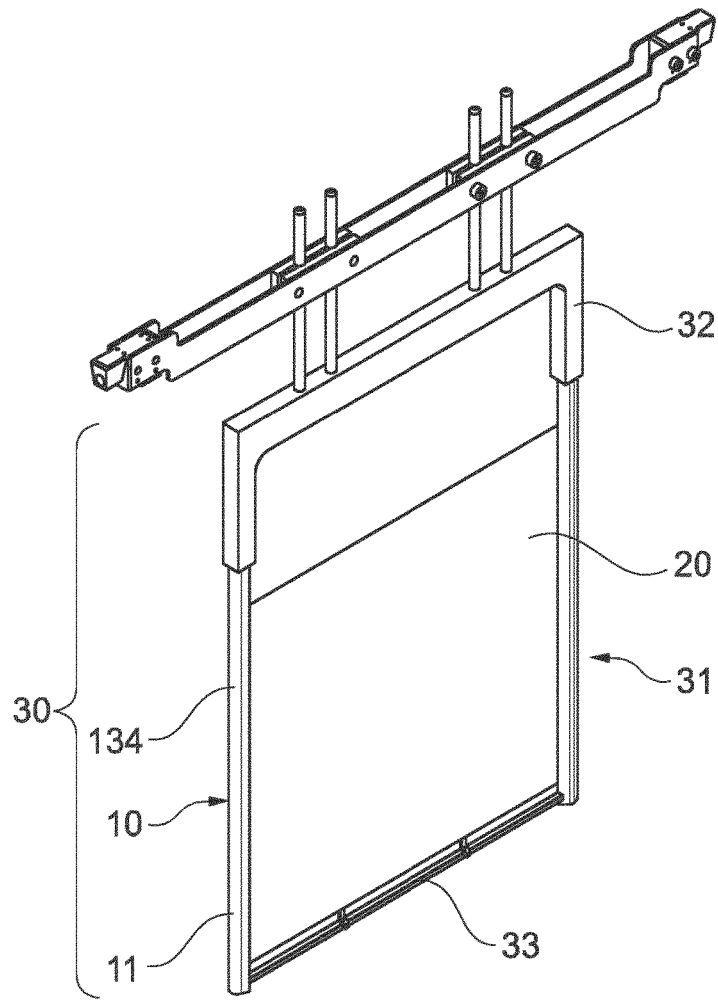
FIG. 4 shows schematically and exemplarily an embodiment of a clipping module for fastening a substrate for a surface treatment of the substrate according to the disclosure in another perspective.

Above described clipping mechanism 10 can be understood as a first clipping mechanism 10. FIGS. 4 and 5 show schematically and exemplarily an embodiment of a clipping module 30 for fastening a substrate 20 for a surface treatment of the substrate 20 according to the disclosure in different perspectives. FIG. 4 shows a 3D view of the clipping module 30 with the substrate 20. FIG. 5 shows a portion of the clipping module 30 with the substrate 20 from below. The clipping module 30 comprises the first clipping mechanism 10 as described above, a second clipping mechanism 31 and a connecting unit 32. The connecting unit 32 or connecting bar is arranged between the first clipping mechanism 10 and the second clipping mechanism 31 to connect the first clipping mechanism 10 and the second clipping mechanism 31 so that the first clipping mechanism 10, the connecting unit 32 and the second clipping mechanism 31 together surround three lateral sides of the substrate 20. In FIGS. 4 and 5, the first clipping mechanism 10, the connecting unit 32 and the second clipping mechanism 31 form together a frame surrounding an upper and two lateral sides of the substrate 20. The first clipping mechanism 10 and the second clipping mechanism 31 contact hold and support the substrate 20. The connecting unit 32 is here only connecting the first clipping mechanism 10 and the second clipping mechanism 31 without touching, contacting or holding the substrate 20. However, the connecting unit 32 may also be formed to contact and support the substrate 20. Additionally or alternatively, there might also be another connecting unit 33 connecting the first clipping mechanism 10 and the second clipping mechanism 31, but being arranged at a lower side of the substrate 20. Also this other connecting unit 33 may contact or may not contact the substrate 20.

FIGS. 6a and 6b show schematically and exemplarily an embodiment of a clipping mechanism 10 for fastening a substrate 20 for a surface treatment of the substrate 20 according to the disclosure in a cross section (FIG. 6a) and in a detail (FIG. 6b). The clipping mechanism 10 and in particular the clipping bracket 11 and the actuation unit 12 comprises a channel 18 extending along a longitudinal axis L of the clipping mechanism 10. The channel 18 is arranged in the clipping bracket 11. There are openings 19 in the channel 18, which preferably extend perpendicular to the longitudinal axis L of the clipping mechanism 10. Also other directions are possible. Some of the openings 19 are directed to the substrate 20 and some of the openings 19 are directed in other, e.g. opposite directions. They may apply a fluid and/or a gas (shown by arrows) to the substrate 20 and the actuation unit 12 as well as to the clipping bracket 11. The openings 19 are here rinse and drying jets. The channel 18 is connected to a reservoir (not shown) holding the fluid and/or gas for rinsing and drying. The channel 18 allows a rinsing and drying of the substrate 20, the clipping bracket 11, the actuation unit 12 and the openings 19 of the channel 18 to enable a very fast rinsing and drying and to avoid a formation of drying residues. Additionally, there can be rinsing and/or drying channel(s) 18 and opening(s) 19 located at a holding frame of the substrate 20 and/or at a processing chamber (not shown).

It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and foregoing description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A clipping mechanism for fastening a substrate for a surface treatment of the substrate, comprising:
a clipping bracket, and
an actuation unit comprising an inflatable body,
wherein the clipping bracket comprises in a cross-section a first arm and a second arm,
wherein the first arm is moveable relative to the second arm to a receiving position for the substrate with a receiving distance between the first arm and the second arm and to a fastening position for the substrate with a fastening distance between the first arm and the second arm,
wherein the fastening distance is smaller than the receiving distance,
wherein the actuation unit is at least partially surrounded by the clipping bracket,
wherein the actuation unit comprises a channel extending at least partially along a longitudinal axis (L) of the actuation unit and at least an opening connected to the channel and directed to the clipping bracket to apply a fluid or a gas to the substrate and/or the clipping bracket, and
wherein the inflatable body of the actuation unit is inflatable relative to the clipping bracket to move the first arm in the receiving position or the fastening position.

2. The clipping mechanism according to claim 1, further comprising a pump unit configured to inflate the inflatable body relative to the clipping bracket.

3. A clipping module for holding a substrate for a surface treatment of the substrate, comprising:
a first clapping mechanism for fastening a substrate, comprising:
a clipping bracket, and
an actuation unit,
wherein the clipping bracket comprises in a cross-section a first arm and a second arm,
wherein the first arm is moveable relative to the second arm to a receiving position for the substrate with a receiving distance between the first arm and the second arm and to a fastening position for the substrate with a fastening distance between the first arm and the second arm,
wherein the fastening distance is smaller than the receiving distance,
wherein the actuation unit is at least partially surrounded by the clipping bracket, and
wherein at least a portion of the actuation unit is moveable relative to the clipping bracket to move the first arm in the receiving position or the fastening position,
a second clipping mechanism, and
a connecting unit,
wherein the connecting unit is arranged between the first clipping mechanism and the second clipping mechanism to connect the first clipping mechanism and the second clipping mechanism so that the first clipping mechanism, the connecting unit and the second clipping mechanism together at least partially surround three lateral sides of the substrate,
wherein the actuation unit comprises a channel extending at least partially along a longitudinal axis (L) of the actuation unit and at least an opening connected to the channel and directed to the clipping bracket to apply a fluid or a gas to the substrate and/or the clipping bracket.

4. The clipping module according to claim 3, further comprising a positioning unit configured to rotate at least the first clipping mechanism relative to the connecting unit into a loading position for the substrate.

5. A method for assembling a clipping mechanism for fastening a substrate for a surface treatment of the substrate, comprising:
providing a clipping bracket comprising in a cross-section a first arm and a second arm, wherein at least the first arm is moveable relative to the second arm to a receiving position for the substrate with a receiving distance between the first arm and the second arm and to a fastening position for the substrate with a fastening distance between the first arm and the second arm, wherein the fastening distance is smaller than the receiving distance, and
providing an actuation unit comprising an inflatable body to be at least partially surrounded by the clipping bracket, wherein the actuation unit comprises a channel extending at least partially along a longitudinal axis (L) of the actuation unit and at least an opening connected to the channel and directed to the clipping bracket to apply a fluid or a gas to the substrate and/or the clipping bracket, and wherein the inflatable body of the actuation unit is inflatable relative to the clipping bracket to move the first arm in the receiving position or the fastening position.

6. The method according to claim 5, further comprising:
providing a substrate in an opening provided by the first arm, when the first arm is in the receiving position.

* * * * *